United States Patent
Wang et al.

(10) Patent No.: US 7,068,107 B2
(45) Date of Patent: Jun. 27, 2006

(54) VARIABLE GAIN AMPLIFIER

(75) Inventors: Wen-Chi Wang, Yunlin (TW);
Chao-Cheng Lee, JungLi (TW);
Jui-Cheng Huang, Hsinchu (TW);
Jui-Yuan Tsai, TaiNan (TW)

(73) Assignee: Realtek Semiconductor, Hsinchu (TW)

( * ) Notice: Subject to any disclaimer, the term of this patent is extended or adjusted under 35 U.S.C. 154(b) by 20 days.

(21) Appl. No.: 10/805,297

(22) Filed: Mar. 22, 2004

(65) Prior Publication Data

US 2004/0239421 A1    Dec. 2, 2004

(30) Foreign Application Priority Data

Mar. 27, 2003   (TW) .............................. 92106898 A

(51) Int. Cl.
*H03F 3/30*  (2006.01)
(52) U.S. Cl. ......................................... 330/282; 330/86
(58) Field of Classification Search ................ 330/133, 330/310, 253, 254, 282, 51, 85, 86, 84; 327/416
See application file for complete search history.

(56) References Cited

U.S. PATENT DOCUMENTS

| | | | | |
|---|---|---|---|---|
| 5,399,986 A | * | 3/1995 | Yen | 330/84 |
| 5,668,494 A | * | 9/1997 | Nicollini et al. | 327/416 |
| 6,400,541 B1 | * | 6/2002 | Brett | 361/56 |

* cited by examiner

*Primary Examiner*—Robert Pascal
*Assistant Examiner*—Hieu Nguyen
(74) *Attorney, Agent, or Firm*—Troxell Law Office PLL

(57) ABSTRACT

The variable gain amplifier of the present invention includes at least an operation amplifier. By choosing one of output stages, a feedback resistor is selected and the gain of the variable gain amplifier is decided according to the resistance of the selected feedback resistor, as desired. By adjusting the gain of the variable gain amplifier, the received signals can be amplified or attenuated in accordance with design requirement. The variable gain amplifier can include a two-stage architecture, in which a first stage is used for coarse gain adjustment and a second stage is used for fine gain adjustment. The gain of the two-stage variable gain amplifier can be easily adjusted to a desired value.

17 Claims, 6 Drawing Sheets

VARIABLE GAIN AMPLIFIER

FIELD OF THE INVENTION

The present invention relates to an operational amplifier, and more particularly, to a variable gain amplifier.

BACKGROUND OF THE INVENTION

Please refer to FIG. 1, which is a schematic diagram depicting the framework of a conventional variable gain amplifier 100. The variable gain amplifier 100 has an operational amplifier 110, a resistor set 120 having a plurality of serial-connected resistors Rf1, Rf2, . . . , Rfn, and a switch set 130 having a plurality of switches SW1, SW2, . . . , SWn corresponding to the resistors respectively. The switches are generally implemented with MOS transistors. Under such configuration of FIG. 1, a gain G of the variable gain amplifier 100 is given by: G=1+Rf/Rg, wherein Rf is a resistance seen between the output Vo and the inverting input (−) of the operational amplifier 110, while Rg is a resistance seen between the inverting input (−) of the operational amplifier 110 and a ground node Vag. Both the resistance Rf and Rg depend on the on/off state of the corresponding switches in the switch set 130. The conventional variable gain amplifier 100 can ensure a monotonic variation in gain, and can avoid nonlinear distortion and gain error caused by the MOS switches since there is no current flowing through the MOS switches.

However, since the signal at the non-inverting input (+) of the operational amplifier 110 varies with the input signal Vi and the input dynamic range of the operational amplifier 110 is comparatively small, the conventional variable gain amplifier 100 tends to suffer from more significant distortion. In addition, the conventional variable gain amplifier 100 cannot perform signal attenuation and possesses inferior gain accuracy.

Please refer to FIG. 2, which is a schematic diagram depicting the framework of another conventional variable gain amplifier 200. The variable gain amplifier 200 has an operational amplifier (OPA) 210, an input resistor Ri, a feedback resistor set 220 having a plurality of serial-connected resistors Rk1, Rk2, . . . , Rkn, and a switch set 230 having a plurality of switches Sk1, Sk2, . . . , Skn corresponding respectively to the resistors. The switches are generally implemented with MOS transistors. Under such configuration of FIG. 2, a gain G of the variable gain amplifier 100 is given by: G=Rk/Ri, wherein Rk is an equivalent resistance shown by the resistor set 220. As seen in FIG. 2, the non-inverting input (+) of the OPA 210 is fixed to a ground node Vag. Therefore, the OPA 210 tends to have smaller distortion.

However, since current will flow through the MOS switches in this framework, the nonlinearity of the MOS switch may incur signal distortion. Also, gain error may be induced by the impedance of the MOS switch. In addition, in FIG. 2 if the tolerable noise level is low, the input resistor Ri with a small impedance and the feedback resistors with small impedances are needed. However, when the impedances of the input resistor and the feedback resistors are of small values, the MOS switches with large equivalent resistances is required so as to reduce distortion and gain error. Unfortunately, when large-resistance MOS switches are adopted, the parasitic capacitors thereof tend to cause loop instability and substrate coupling issues.

SUMMARY OF THE INVENTION

It is one of the many objects of the present invention to provide a variable gain amplifier capable of amplifying and attenuating the received signals with the characteristics of low distortion and low noise.

According to embodiments of the present invention, a variable gain amplifier is disclosed. The variable gain amplifier comprises an input resistor coupled to an input signal; an operational amplifier comprising a pre-drive stage coupled to the input resistor and a plurality of output stages, each of which coupled to the pre-drive stage; and a plurality of feedback resistors, each feedback resistor being coupled to the pre-drive stage by one end thereof and coupled to one of the plurality of output stages by another end thereof. A feedback loop is formed by one of the output stages chosen by a first control signal and the feedback resistor corresponding to the chosen output stage.

These and other objectives of the claimed invention will no doubt become obvious to those of ordinary skill in the art after reading the following detailed description of the preferred embodiment, which is illustrated in the various figures and drawings.

DETAILED DESCRIPTION OF THE EMBODIMENTS

According to embodiments of the present invention, variable gain amplifiers comprising operational amplifiers and resistors are disclosed. The variable gain amplifier may comprise an input resistor, a pre-drive stage of an operational amplifier, a plurality of output stages of the operational amplifier and a plurality of feedback resistors each coupled respectively to a corresponding output stage. In one embodiment of the present invention, the pre-drive stage, the output stages and the feedback resistors may be lumped on a single integrated circuit (IC), and the input resistor may either be integrated on the same IC or be disposed externally. One end of each input resistor is connected to the input signal, and the other end thereof is connected to an input pad of the IC. In another embodiment, the input resistor may be connected to the IC by way of an electrostatic discharge (ESD) protection device so as to prevent the damage to the variable gain amplifier from happening while the magnitude of the received signal is too large.

Figure 3:
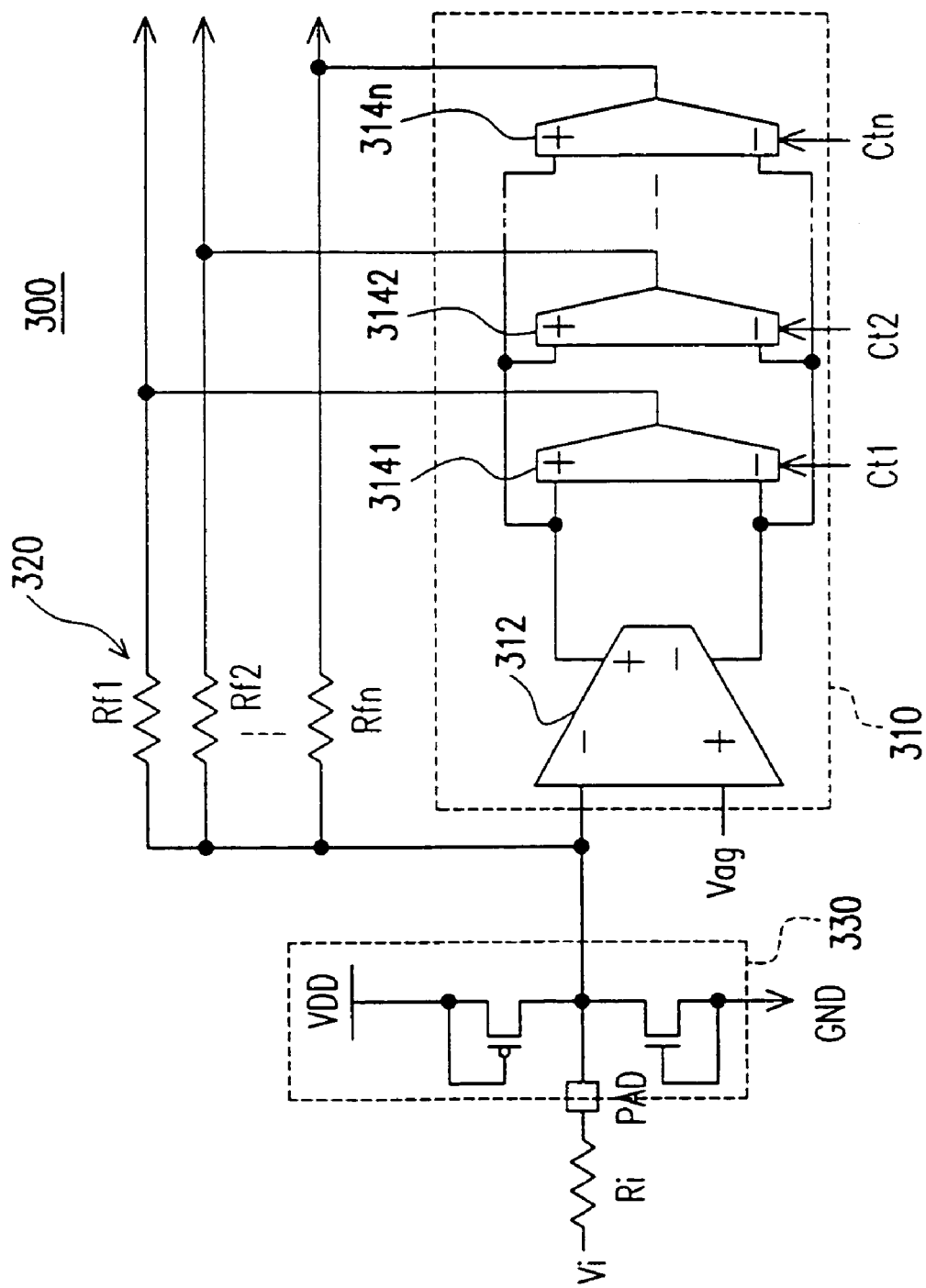
FIG. 3 is a schematic diagram of a variable gain amplifier according to an embodiment of the present invention.

In one embodiment of the present invention as seen in FIG. 3, a variable gain amplifier 300 comprises an operational amplifier 310, an input resistor Ri, and a plurality of feedback resistors Rf1, Rf2, . . . , Rfn. The operational amplifier 310 further comprises a pre-drive stage 312, and a plurality of output stages 3141, 3142, . . . , 314n. The non-inverting output of the pre-drive stage 312 is connected to the non-inverting inputs of the plurality of output stages 3141, 3142, . . . , 314n, and the inverting output of the pre-drive stage 312 is connected to the inverting inputs of the plurality of output stages 3141, 3142, . . . , 314n. Each output stage 314i is coupled to a corresponding feedback resistor Rfi and also is coupled to a corresponding control signal Cti, where i=1, . . . , n. The output of each output stage 314i is coupled to the inverting input of the pre-drive stage 312 via a corresponding feedback resistor Rfi. One end of the input resistor Ri is connected to the input signal Vi, and the other end of the input resistor Ri is connected to an input pad and is further connected to the inverting input of the pre-drive stage 312 via an ESD 330.

Controlled by the control signals Ct1, Ct2, . . . , Ctn, a gain G of the operational amplifier 300 is determined by the output stage 314i chosen and driven by the foregoing control signals accompanying the feedback resistor Rfi coupled thereto, and is given as: G=Rfi/Ri. It is noted that the resistances of the feedback resistors are properly predetermined according to design requirement so as to provide different gain values with different output stages being chosen. Thus, the gain G of the variable gain amplifier 300 can be adjusted as desired and the received signal can be amplified/attenuated by employing the control of the output stages. In this regard, the phenomena of loop instability and substrate coupling, as well as non-linear distortion can be alleviated. Hence, the variable gain amplifier 300 can be utilized in applications demanding very low noise level, such as the asymmetric digital subscriber line (ADSL) communication system.

Figure 4:
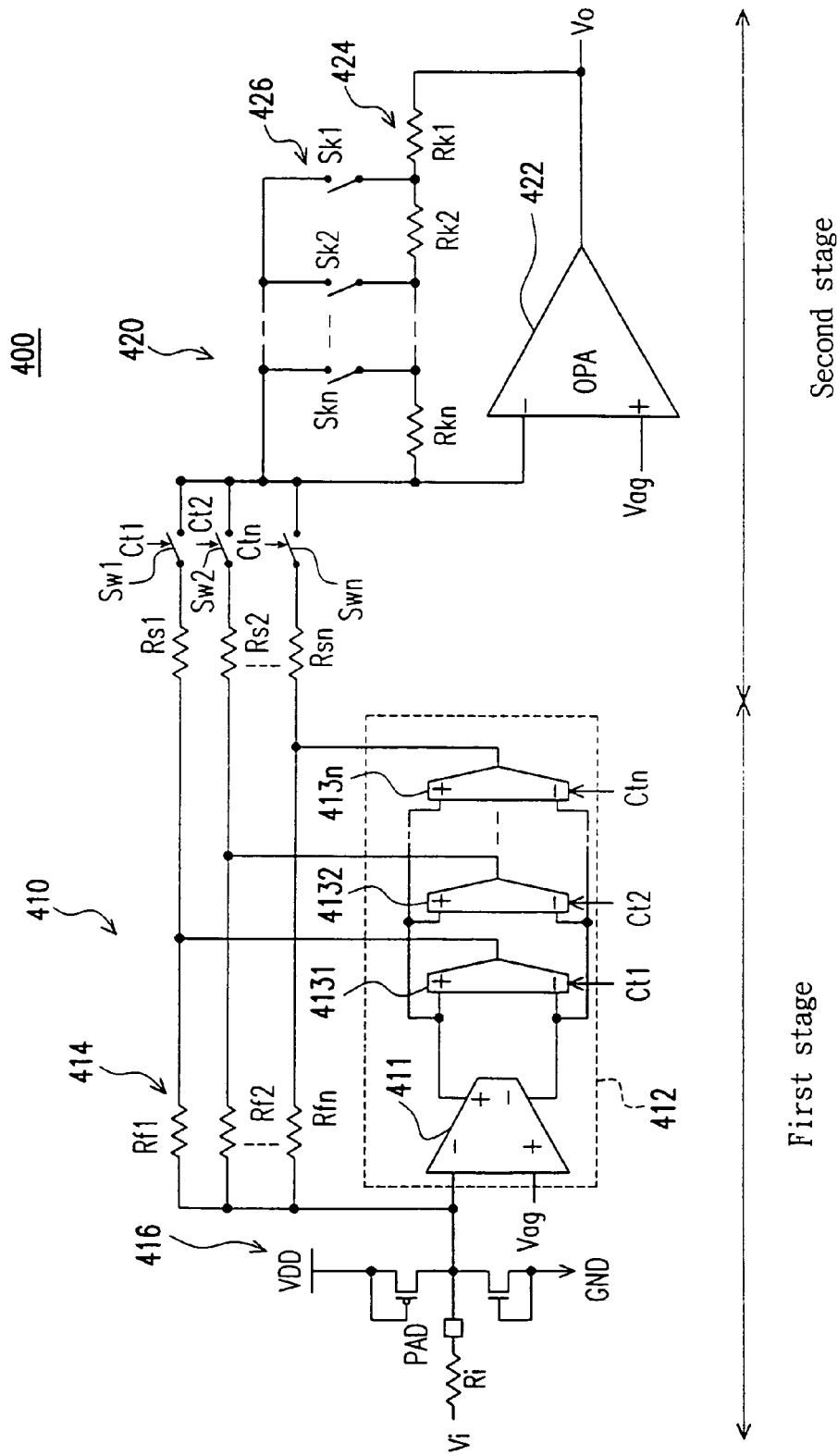
FIG. 4 is a schematic diagram of a variable gain amplifier according to another embodiment of the present invention.

Please refer to FIG. 4, which is a schematic diagram of a variable gain amplifier 400 according to another embodiment of the present invention. The variable gain amplifier 400 comprises a first stage operational amplification unit 410 and a second stage operational amplification unit 420, in which the first stage operational amplification unit 410 is used for coarse gain adjustment and the second stage operational amplification unit 420 is used for fine gain adjustment. By adopting the two-stage gain adjustment approach, since the input referred noise of the second stage operational amplification unit 420 can be far higher than that of the first stage operational amplification unit 410, both input resistors with larger resistances and feedback resistors with larger resistances can be adopted, and MOS switches with smaller resistances can also be used, without causing obvious non-linear distortion and gain error.

The first stage operational amplification unit 410 as seen in FIG. 4 comprises an operational amplifier 412, a input resistor Ri and a plurality of feedback resistors 4131, 4132, . . . , 413n. The operational amplifier 410 comprises a pre-drive stage 411, and a plurality of output stages. 4131, 4132, . . . ,413n. Each output stage 413i is controlled by a corresponding control signal Cti, where i=1, . . . ,n. As those skilled in the art can appreciate, the first stage operational amplification unit 410 in FIG. 4 is similar to the variable gain amplifier 300 in FIG. 3, and detailed description is thus omitted herein for simplicity.

The second stage operational amplification unit 420 as seen in FIG. 4 comprises an operational amplifier 422, a plurality of input resistors Rs1, Rs2, . . . , Rsn, a plurality of switches Sw1, Sw2, . . . , Swn corresponding respectively to each input resistor, a plurality of feedback resistors Rk1, Rk2, . . . , Rkn, and a plurality of switches Sk1, Sk2, . . . , Skn corresponding respectively to each feedback resistor. Each input resistor Rsi is coupled to the inverting input of the operational amplifier 422 by way of the corresponding switch Swi, wherein every switch Swi is controlled by a control signal Cti of the first stage operation amplification unit 410, wherein i=1, 2, . . . , n. The non-inverting input of the operation amplifier 422 is connected to a virtual ground Vag. The output of the operational amplifier 422 is coupled to the inverting input thereof by way of the feedback resistors Rk1, Rk2, . . . , Rkn and the corresponding switches Sk1, Sk2, . . . , Skn.

Figure 1:
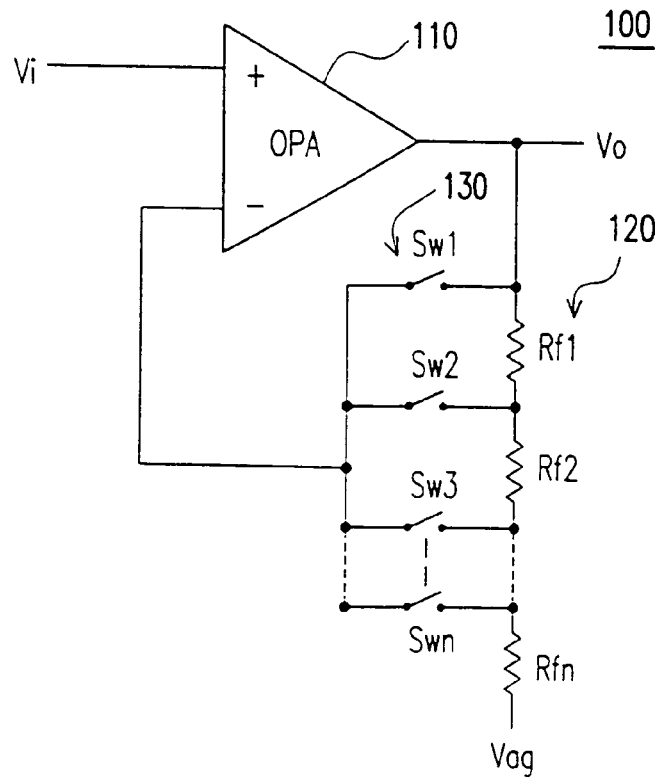
FIG. 1 is a framework of a conventional variable gain amplifier.
Figure 2:
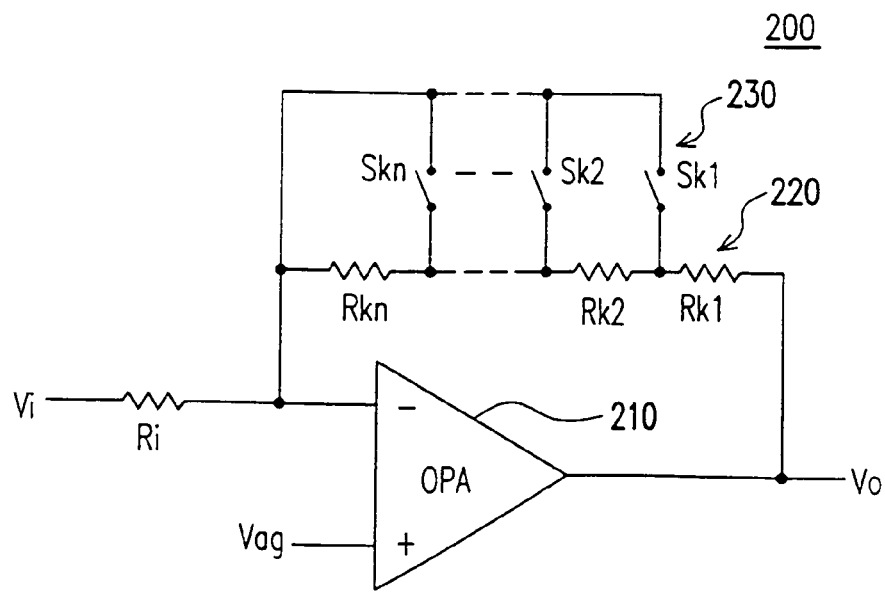
FIG. 2 is a framework of another conventional variable gain amplifier.

In this embodiment, the first stage operational amplification unit 410 is used for coarse gain adjustment and the second stage operational amplification unit 420 is used for fine gain adjustment, where the overall operation process is illustrated using the following example. Initially, one output stage out of the output stages 4131, 4132, . . . , 413n, that is chosen by the plurality of control signals Ct1, Ct2, . . . , Ctn, is couple to the pre-drive stage 414, for enabling a gain Gc of the first stage amplification unit 410, which is also the coarse gain of the overall variable gain amplifier, to be Gc=Rfi/Ri, wherein Rfi is the resistance of the feedback resistor corresponding to the chosen output stage. It is noted that the framework of the second stage amplification unit 420 is similar to that of the aforementioned variable gain amplifier with reference to FIG. 2 and the corresponding description. Thus, the fine gain Gf of the second operational amplification unit 420 is determined by the MOS switch Swi corresponding to the chosen output stage and a selected switch Ski. Finally, the total gain of the variable gain amplifier 400 is G=Gc×Gf.

The adjustment ranges of both the coarse gain and the fine gain can be varied as desired. For instance, the adjustment range of the coarse gain Gc depends, among other factors, on the number of the output stages 413i, i=1, . . . ,n and the corresponding feedback resistors Rfi, i=1, . . . ,n. Similarly, the adjustment range of the fine gain Gf depends, among other factors, on the number the feedback resistors Rki, i=1, . . . ,n and the corresponding Ski, i=1, . . . ,n. Thereby the present invention has good design flexibility for fulfilling all kinds of requirement.

For example, when designing a low-noise variable gain amplifier with −18 dB~23 dB gain range having 1 dB step, the variable gain range of the first stage amplification unit 410 may be set to be −18 dB~18 dB with 6 dB step, and the variable gain range of the second stage amplification unit 420 may be set to be 0 dB ~5 dB having 1 dB step. Assuming that the first stage input impedance Ri is 1 kΩ, then seven feedback resistors Rf1, Rf2, . . . , Rf7 are required in the first stage operational amplification unit 410 since the variable gain range is −18 dB~18 dB with 6 dB step, wherein resistances of the seven feedback resistors are 125Ω, 250Ω, 500Ω, 1 kΩ, 2 kΩ, 4 kΩ, 8 kΩ, respectively. All the second stage input impedance Rs1, Rs2, . . . , Rs7 are then set to be 20 kΩ. Six feedback resistors Rk1, Rk2, . . . , Rk6 are required in the second stage operational amplification unit 420 since the variable gain range is 0 dB~5 dB with 1 dB step, wherein resistances of the six feedback resistors are 20 kΩ, 2 kΩ, 3 kΩ,3 kΩ, 4 kΩ, 4 kΩ.

Figure 4A:
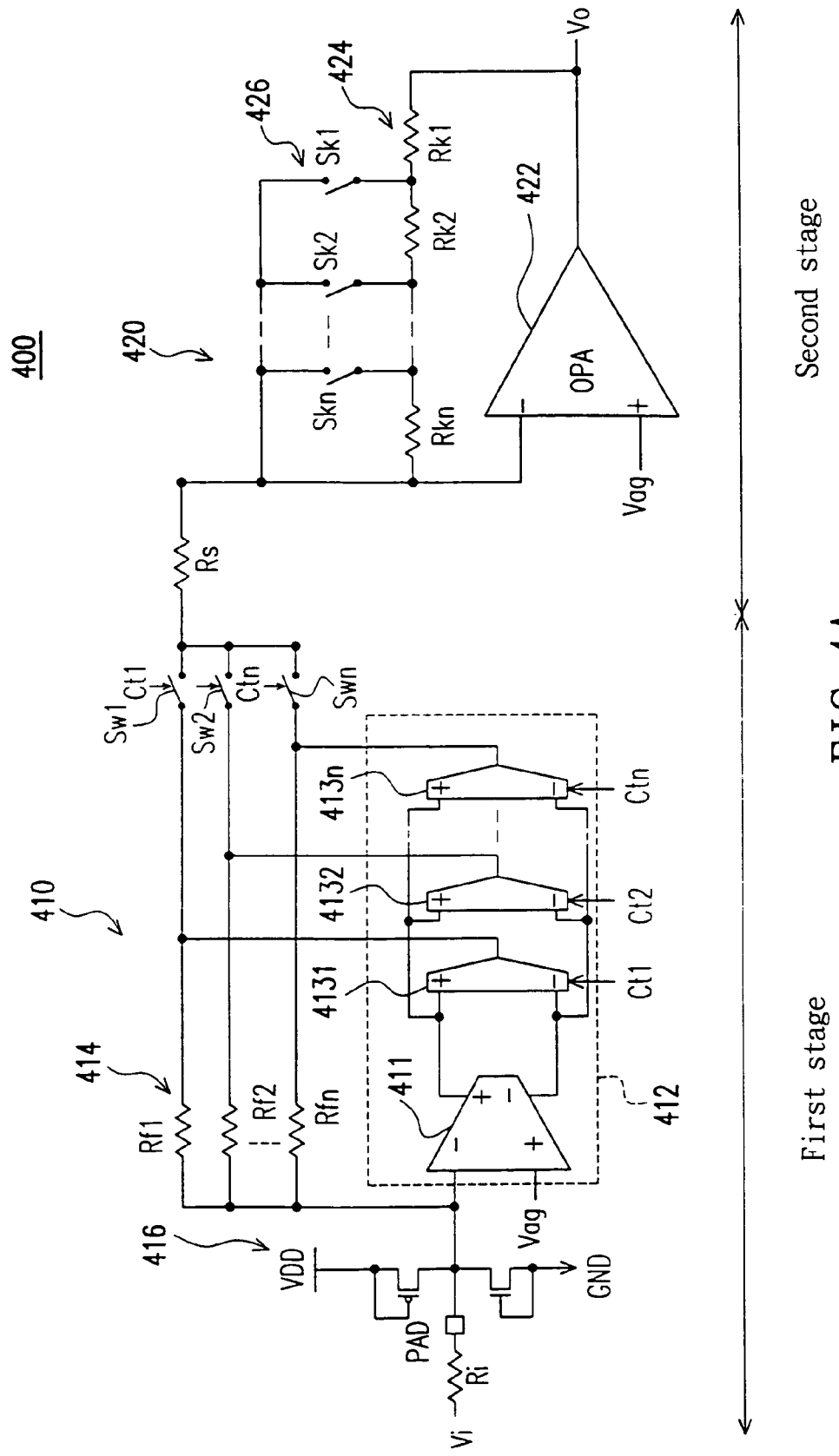
FIG. 4A is a schematic diagram of a variable gain amplifier according to yet another embodiment of the present invention.

Please refer to FIG. 4A, which is a schematic diagram of a variable gain amplifier according to yet another embodiment of the present invention. The variable gain amplifier 400 has a first stage operational amplification unit 410 and a second stage operational amplification unit 420, which both are basically similar to those of FIG. 4. The difference between the embodiment of FIG. 4 and the embodiment of FIG. 4A is that the plurality of input resistors Rsi, i=1, . . . , n, are replaced by a single input resistor Rs. As a result, the adjustment range of the fine gain of the second stage amplification unit 420 depends, among other factors, on the number the feedback resistors Rki, i=1, . . . ,n, and the corresponding switches Ski, i=1, . . . ,n.

Figure 5:
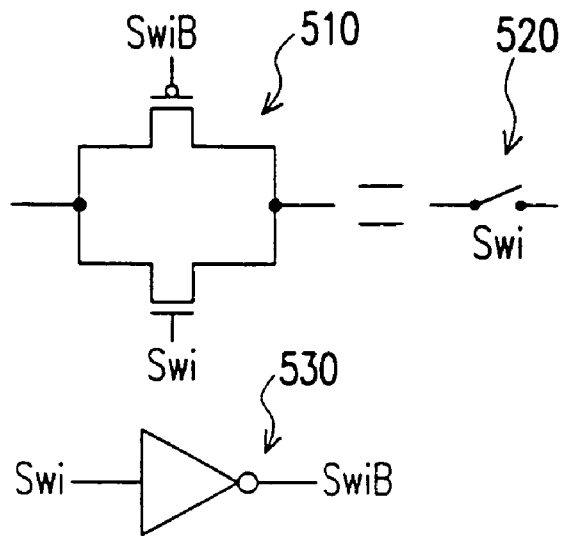
FIG. 5 is an embodiment of the switch of FIG. 4.

FIG. 5 is an embodiment of the switches of FIG. 4. As seen in FIG. 5, the switch 510 comprises a transmission gate configuration composed of two MOS transistors. A PMOS transistor and an NMOS transistor are controlled to turn on/off by a signal SwiB and a complementary signal Swi thereof, respectively. The switch 510 composed of the two MOS transistors is illustrated as a circuit structure 520. When referencing to the aforementioned embodiments, the signal Swi of the switch 510 is the respective control signal Cti of the operational amplification unit 410.

Figure 6:
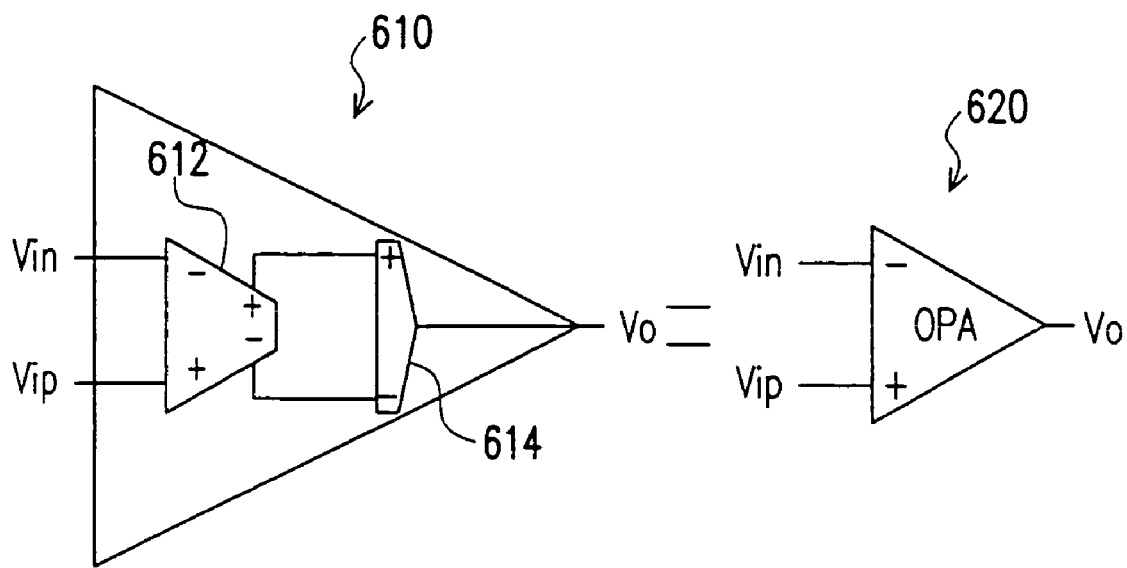
FIG. 6 is an embodiment of the operational amplifier of the operational amplification unit with reference to FIG. 4.

Please refer to FIG. 6, which is an embodiment of an operational amplifier 610 used in the operational amplification unit 410. The operational amplifier 610 comprises a pre-drive stage 612 and a chosen output stage 614.

Figure 7:
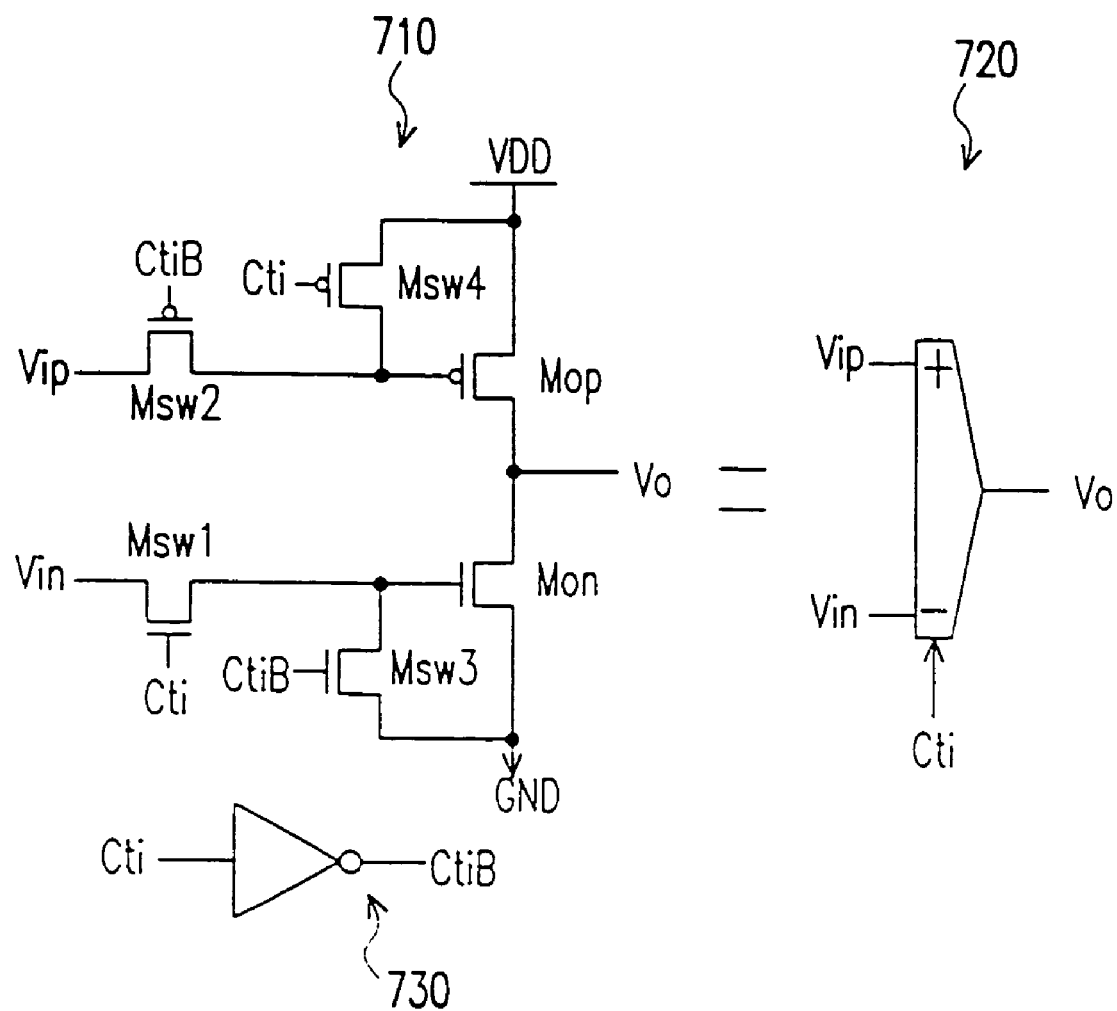
FIG. 7 is an embodiment of the output stage of the operational amplifier with reference to FIG. 4.

FIG. 7 is an embodiment of the output stage 614 of the operational amplifier 610 illustrated by an output stage 710 and a circuit symbol thereof 720. The output stage 710 comprises two output MOS transistors Mon, Mop, and four MOS switches Msw1, Msw2, Msw3 and Msw4, wherein the transistor Mon is a N-type transistor and the transistor Mop is a P-type transistor. The MOS switches Msw1 and Msw4 are controlled by the control signal Cti, while the MOS switches Msw2 and Msw3 are controlled by the complementary signal CtiB of the control signal Cti.

When the output stage 710 is chosen, that is, in this embodiment, the control signal Cti being set to high, the MOS switches Msw1 and Msw2 are on and the MOS switches Msw3 and Msw4 are off, and the output stage 710 is therefore activated.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A variable gain amplifier comprising:
   a first stage operational amplification unit for providing a first gain, comprising:
   a first input resistor coupled to an input signal;
   an operational amplifier comprising:
   a pre-drive stage coupled to the input resistor; and
   a plurality of output stages, each output stage coupled to the pre-drive stage; and
   a plurality of first feedback resistors, each first feedback resistor being coupled to the pre-drive stage by one end thereof and coupled to one of the plurality of output stages by another end thereof; and
   a second stage operational amplification unit coupled to the first stage operational amplification unit, for providing a second gain;
   wherein a first feedback loop is formed by one of the output stages chosen by a first control signal and the first feedback resistor corresponding to the chosen output stage, and a gain of the variable gain amplifier corresponds to the first and the second gain.

2. The variable gain amplifier of claim 1, wherein the second stage operational amplification unit comprises:
   a plurality of second input resistors, each second input resistor being coupled to a corresponding first feedback resistor of the first stage operational amplification unit;
   a plurality of first switches, each first switch being coupled to a corresponding second input resistor;
   a second operational amplifier coupled to the plurality of first switches;
   a plurality of second feedback resistors, being serial-connected with one another, being connected to the plurality of first switches by one end of the serial-connected second feedback resistors and an output of the second operational amplifier by another end thereof; and
   a plurality of second switches, each second switch being coupled to the plurality of first switches by one end and to a corresponding second feedback resistor by another end.

3. The variable gain amplifier of claim 1, wherein the second stage operational amplification unit comprises:
   a plurality first switches, each first switch being coupled to a corresponding first feedback resistor;
   a second input resistor coupled to the plurality of first switches;
   a second operational amplifier coupled to the second input resistor;
   a plurality of second feedback resistors, being serial-connected with one another, being connected to the second input resistor by one end of the serial-connected second feedback resistors and an output of the second operational amplifier by another end thereof; and
   a plurality of second switches, each second switch being coupled to the second input resistor by one end and to a corresponding second feedback resistor by another end.

4. The variable gain amplifier of claim 1, wherein the first input resistor is coupled to the operational amplifier by way of an electrostatic discharge protection device.

5. The variable gain amplifier of claim 1, wherein each of the output stages further comprises:
   a PMOS transistor, whereof a source is connected to a supply voltage;
   an NMOS transistor, whereof a source is grounded and a drain is coupled to the PMOS transistor;
   a first MOS switch coupled between the pre-drive stage and a gate of the NMOS transistor, a gate of the first MOS switch being coupled to the first control signal;
   a second MOS switch coupled between the pre-drive stage and a gate of the PMOS transistor, a gate of the second MOS switch being coupled to a second control signal;
   a third MOS switch coupled between the gate of the NMOS transistor and ground, a gate of the third MOS switch being coupled to the second control signal; and
   a fourth MOS switch control between the gage of the PMOS transistor and the supply voltage, a gate of the fourth MOS switch being coupled to the first control signal;
   wherein the second control signal is a complementary signal fo the first control signal.

6. The variable gain amplifier of claim 1, wherein each output stage further comprises:
   a PMOS transistor coupled to a supply voltage;
   an NMOS transistor coupled between the PMOS transistor and ground;
   a first switch;
   a second switch;
   wherein the first switch is used for connecting a gate of a PMOS transistor to the pre-drive stage when the first control signal is in a first state, and the second switch is used for connecting a gate of the NMOS transistor to the pre-drive stage when the first control signal is in the first state.

7. A variable gain amplifier comprising:
a pre-drive stage comprising a first input node for receiving a input signal;
a plurality of output stages, wherein one of the output stages is selected by a control signal to couple to the pre-drive stage; and
a plurality of feedback impedance, each of the feedback impedances being coupled between the pre-drive stage and one of the output stages;
wherein the pre-drive stage comprising a first output node and a second output node, each of the output stages comprising a first input node, a second input node, and an output node, and each of the feedback impedance is coupled between the first input node of the pre-drive stage and the output node of the corresponding output stage; and
wherein the gain of the variable gain amplifier is determined according to one of the feedback impedances coupled to the selected output stages and the pre-drive stage.

8. The variable gain amplifier of claim 7, wherein the first input node of the selected output stage is coupled to the first output node of the pre-drive stage and the second input node of the selected output stage is coupled to the second output node of the pre-drive stage.

9. The variable gain amplifier of claim 7, wherein the variable gain amplifier further comprising an input impedance coupled to the first input node of the pre-drive stage, wherein the gain of the variable gain amplifier is determined according to the input impedance and one of the feedback impedances coupled to the selected output stages and the pre-drive stage.

10. A variable gain amplifier comprising:
an input resistor;
a pre-drive stage coupled to the input resistor;
a plurality of feedback resistors, each feedback resistor coupled to the pre-drive stage at one end;
a plurality of output stages, each output stage coupled to one of the feedback resistors at another end thereof, forming a plurality of feedback loops; and
a plurality of switches, coupled to one of the feedback loops at one end, and the switches coupled to a later stage at another end;
wherein one of the feedback loops is chosen by one of the switches.

11. The variable gain amplifier of claim 10, wherein the input resistor is coupled to the operational amplifier by way of an electrostatic discharge protection device.

12. The variable gain amplifier of claim 10, wherein each of the output stages further comprises:
a PMOS transistor, whereof a source is connected to a supply voltage;
an NMOS transistor, whereof a source is grounded and a drain is coupled to the PMOS transistor;
a first MOS switch coupled between the pre-drive stage and a gate of the NMOS transistor, a gate of the first MOS switch being coupled to a first control signal;
a second MOS switch coupled between the pre-drive stage and a gate of the PMOS transistor, a gate of the second MOS switch being coupled to a second control signal;
a third MOS switch coupled between the gate of the NMOS transistor and ground, a gate of the third MOS switch being coupled to the second control signal; and
a fourth MOS switch coupled between the gate of the PMOS transistor and the supply voltage, a gate of the fourth MOS switch being coupled to the first control signal;
wherein the second control signal is a complementary signal of the first control signal.

13. The variable gain amplifier of claim 10, wherein each output stage further comprises:
a PMOS transistor coupled to a supply voltage;
a NMOS transistor coupled between the PMOS transistor and ground;
a first switch;
a second switch;
wherein the first switch is used for connecting a gate of the PMOS transistor to the pre-drive stage when a first control signal is in a first state, and the second switch is used for connecting a gate of the NMOS transistor to the pre-drive stage when the first control signal is in the first state.

14. A variable gain amplifier comprising:
a pre-drive stage comprising a first input node for receiving an input signal;
a plurality of feedback elements with impedance are coupled to the pre-drive stage at one end;
a plurality of output stages, each output stage coupled to one of the feedback elements at another end thereof, forming a plurality of feedback loops; and
a plurality of switches, coupled to one of the feedback loops at one end, and the switches coupled to a later stage at another end;
wherein the gain of the variable gain amplifier is determined according to the on and off state of the switches.

15. The variable gain amplifier of claim 14, wherein the pre-drive stage comprises a first output node and a second output node, each of the output stages comprising a first input node, a second input node, and a output node, and each feedback element is coupled between the first input node of the pre-drive stage and the output node of the corresponding output stage.

16. The variable gain amplifier of claim 15, wherein the first input node of the selected output stage is coupled to the first output node of the pre-drive stage and the second input node of the selected output stage is coupled to the second output node of the pre-drive stage.

17. The variable gain amplifier of claim 14, wherein the variable gain amplifier further comprises an input element with impedance coupled to the first input node of the pre-drive stage, wherein the gain of the variable gain amplifier is determined according to the input element and one of the feedback elements coupled to the selected output stages and the pre-drive stage.

* * * * *